United States Patent [19]
Tanimoto

[11] Patent Number: 5,170,293
[45] Date of Patent: Dec. 8, 1992

[54] EXPOSURE MECHANISM
[75] Inventor: Keisuke Tanimoto, Ikoma, Japan
[73] Assignee: Sharp Kabushiki Kaisha, Osaka, Japan
[21] Appl. No.: 835,746
[22] Filed: Feb. 13, 1992
[30] Foreign Application Priority Data Feb. 18, 1991 [JP] Japan ................................. 3-23510

[51] Int. Cl.$^5$ .............................................. G02B 5/00
[52] U.S. Cl. .................................... 359/894; 359/799; 250/492.2; 356/401
[58] Field of Search ............... 359/885, 888, 894, 798, 359/799, 800, 801; 250/492.2, 491.1; 356/400, 401; 445/4, 30

[56] References Cited
U.S. PATENT DOCUMENTS 2,660,923 12/1953 Benford ................................ 359/799
3,193,687 7/1965 Hatcher ................................ 359/888
3,856,418 12/1974 Levine ................................. 359/888
4,578,587 3/1986 Behringer et al. ................. 250/492.2
4,694,178 9/1987 Harte ................................ 250/492.2
4,794,426 12/1988 Nishi ..................................... 356/400
4,798,470 1/1989 Moriyama et al. ................. 356/401

OTHER PUBLICATIONS

SPIE vol. 1261 Integrated Circuit Metrology, Inspection and Process Control IV (1990), pp. 315–324.

Primary Examiner—Loha Ben
Attorney, Agent, or Firm—Nixon & Vanderhye

[57] ABSTRACT

An exposure mechanism having a hole pattern for forming a resist pattern to be used in a photolithography process when a semiconductor device is fabricated, the hole pattern including a central light transmitting portion provided on a transparent substrate, through which exposed light can pass, a plurality of slit-shaped light transmitting portions provided around the central light transmitting portion, and a light intercepting portion provided on the transparent substrate for forming the central light transmitting portion and the slit-shaped light transmitting portions.

4 Claims, 13 Drawing Sheets

EXPOSURE MECHANISM

BACKGROUND OF THE INVENTION

1. Field of the Invention

The present invention relates to an exposure mechanism to be used for forming a hole when a semiconductor device is fabricated, and more particularly to an exposure mechanism having a hole pattern of which line width is hard to vary after development even if there is the focus variation of an exposure device, i.e., in the state of defocus such as the shift of a focal position of exposed light on a resist, for example, 1 or 2μm focal shift when the exposed light is radiated onto the resist so as to form a desired resist pattern in a photolithography process in which the exposure device is used.

2. Description of the Prior Art

In general, there has been adopted the following exposure mechanism in order to form a resist in a wafer by means of the hole pattern of an exposure device so as to have a predetermined shape, and then form a hole such as a contact hole having a predetermined diameter by using a resist pattern as a mask.

As shown in FIG. 19, (a) exposed light L is emitted from a mercury lamp 31 opposed to a converging mirror 30, passes through a pair of relay mirrors 32 and then reaches a condenser lens 33, and (b) the exposed light passes through the condenser lens 33, a hole pattern 1 having a predetermined shape on a reticle and a reduction lens 34, and is converged by an autofocus optical system as a focusing mechanism including a light source 35 and a detector 36 such that its focal plane comes to the resist film of a water 38 provided on a wafer chuck 37.

FIGS. 20, 22 and 24 show the positional relationship between a wafer 38 comprised of a substrate 39 and a resist layer 12, and the focal plane of the exposed light passing through the holes pattern 1. The substrate 39 is comprised of a Si substrate on which a semiconductor device (not shown) is formed and an insulating film laminated on the Si substrate. The resist layer 12 is laminated over the substrate 39.

In FIGS. 20, 22 and 24, the reference designation of denotes one of focal points determined by the reduction lens 34 when the exposed light passing through the hole pattern 1 passes through the reduction lens 34.

In FIG. 20, a focal plane 13a is provided in the resist layer 12 (the state of just focus), for example. Consequently, there can be obtained a resist pattern 14a having a predetermined shape (see FIG. 21).

In FIG. 22, a focal plane 13b corresponds to the upper face of the resist layer 12 (the state of defocus), for example. Consequently, there cannot be obtained a resist pattern having a predetermined shape. More specifically, the focal plane 13b is shifted upward from the focal plane 13a so that light necessary for exposure does not reach the lower portion of the resist layer 12. Consequently, there is formed a resist pattern 14b having a resist portion which is not exposed (see FIG. 23).

In FIG. 24, a focal plane 13c corresponds to the lower face of the resist layer 12 (the state of defocus), for example. Consequently, there cannot be obtained a resist pattern having a predetermined shape. More specifically, the focal plane 13c is shifted downward from the focal plane 13a so that a resist portion to remain is exposed. Consequently, there is formed a resist pattern 14c in which the resist portion to remain is removed (see FIG. 25).

The focal position of exposed light which is incident on the resist film 12 is shifted for the following reasons.

1. The misrecognition of the upper and lower positions of the wafer 38 by the autofocus optical systems 35 and 36.

2. The flatness and slant of the wafer caused by film formation on a semiconductor device or the like in a semiconductor fabricating process.

3. The flatness of the wafer chuck 37 supporting the wafer 38.

4. The shift of a focal position in an exposed light radiation area which is caused by the aberration of a lens in an exposure mechanism (focal shift in the lens).

From the foregoing, there is determined focusing precision at an exposure step. Conventionally, when the focus of an exposure device is slightly shifted (up to 1μm), a dimension after development is greatly varied. By way of example, the dimension after development is reduced to 1 to several μm.

Referring to an exposure mechanism according to the prior art, there has been used a hole pattern having only one square or rectangular light transmitting portion through which exposed light can pass.

As shown in FIG. 26, a hole pattern 51 includes a square light transmitting portion (hole) 52 having a side L (line segment B'B=line segment BB''=L) of 3.6μm and a light intercepting portion 53 which forms the light transmitting portion 52. Consequently, when the focus of the exposure device is slightly shifted (up to 1μm), the dimension after development may greatly be varied. It is just the same with a hole pattern having a rectangular light transmitting portion.

FIG. 27 shows a curve a illustrating the change of relative light intensity distribution in the case where a quantity of focal shift is 0μm, a curve b illustrating the change of relative light intensity distribution in the case where the quantity of focal shift is 1μm, and a curve c illustrating the change of relative light intensity distribution in the case where the quantity of focal shift is 2μm, in which the hole pattern 51 shown in FIG. 26 is used.

The relative light intensity distribution is calculated by computed simulation. In FIG. 27, an axis of ordinates denotes a relative light intensity. In FIG. 19, to 1 is set a point at which the focal plane of exposed light passing through the reduction lens 34 comes to the resist film of the wafer 38. An axis of abscissas denotes a distance from the center T of the hole pattern 51. An area surrounded by a broken line is a light transmitting portion 52. The edge of the hole pattern 51 is shown by a broken line apart from the center T by a distance of 1.8μm as shown by an arrow E (In FIG. 26, the edge is shown by line segments TB and BB''). The line segment TB has length of 1.8μm.

In the case where the hole pattern 51 shown in FIG. 26 according to the prior art is used, the curves a, b and c are changed over a relative light intensity of 0 to 1.1 when the quantity of focal shift is varied.

However, the change of a line width, i.e., developing shift S produces an effect on the diameter of a contact hole formed on the insulating layer of a wafer. When focusing variation is not caused as in case of just focus in which the quantity of focal shift is 0μm as shown in FIG. 17, contact hole 20a formed on the insulating layer 20 of the wafer has a diameter P2. As shown in FIGS. 16 and 18, contact holes 21a and 22a formed on insulating layers 21 and 22 have diameters Q2 and R2, respectively. In general, the developing shift S is obtained by subtracting a mask dimension M (respresented by an opening diameter L in FIG. 26) from the hole diameter P2, Q2 and R2 after development.

In case of defocus in which the quantity of focal shift is 1 or 2μm, it is seen that the diameters Q2 and R2 of the contact holes 21a and 22a formed on the insulating layers 21 and 22 are greatly shifted from the diameter P2 of the contact hole 20a shown in FIG. 17. More specifically, the shape of the contact hole in the state of defocus is shifted from that in the state of just focus.

It is an object of the present invention to provide an exposure mechanism in which a line width is hard to change even if the focus of an exposure device is varied.

SUMMARY OF THE INVENTION

The present invention provides an exposure mechanism having a hole pattern for forming a resist pattern to be used in a photolithography process when a semiconductor device is fabricated, the hole pattern comprising a central light transmitting portion provided on a transparent substrate, through which exposed light can pass, a plurality of slit-shaped light transmitting portions provided around the central light transmitting portion, and a light intercepting portion provided on the transparent substrate for forming the central light transmitting portion and the slit-shaped light transmitting portions.

PREFERRED EMBODIMENT

The present invention is characterized in that the focus variation of an exposure device is avoided by a hole pattern formed on a reticle so as to have a particular shape. Referring to an exposure mechanism having the hole pattern, even if the focus of the exposure device is varied, a dimension after development is not affected.

Figure 9:
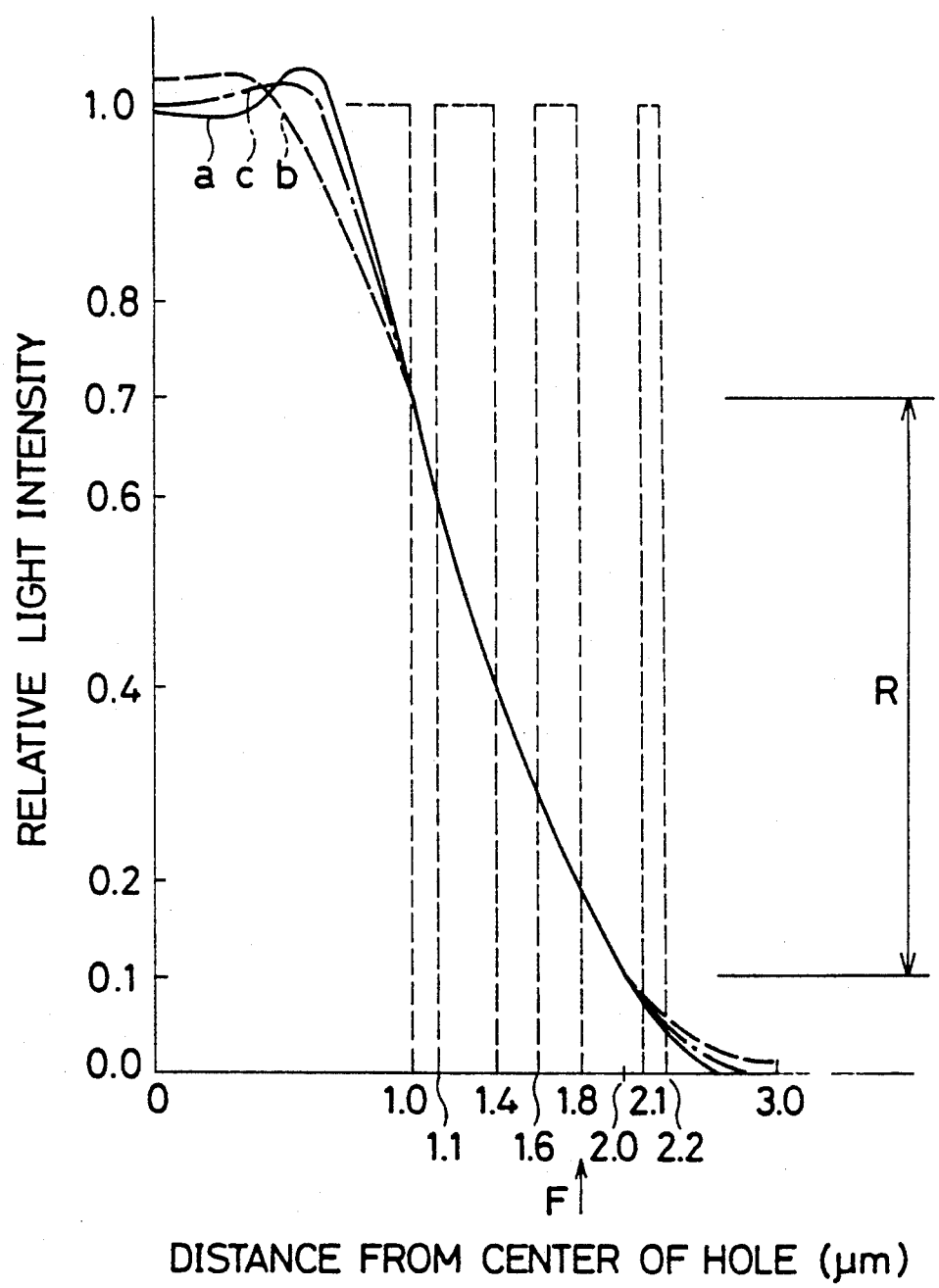
FIG. 9 is a characteristic chart showing relative light intensity distribution in the case where there is used the hole pattern according to the first embodiment of the present invention.

More specifically, a hole pattern has a sturcture in which a plurality of slit-shaped light transmitting portions are provided around a central light transmitting portion. Consequently, the focal distance of each light transmitting portion can be set by the diffraction effects of the central light transmitting portion and the slit-shaped light transmitting portions or the mutual diffraction effects of the slit-shaped light transmitting portions. In the state of defocus, furthermore, there is no difference in relative light intensity distribution as shown in FIG. 9. As a result, a focal tolerance can be increased. In addition, the relative light intensity distribution on the exposed plane of a resist film in not changed irrespective of focus variation. Thus, the dimension after development is not affected.

According to the present invention, it is necessary for the hole pattern to have a plurality of slit-shaped light transmitting portions. As a result of studies, the present inventor has found that the dimension after development is affected by the focus variation of the exposure device in the case where only one slit-shaped light transmitting portion is provided around the central light transmitting portion, so that the above-mentioned drawbacks can be eliminated if two or more slit-shaped light transmitting portions are provided around the central light transmitting portion.

Figure 1:
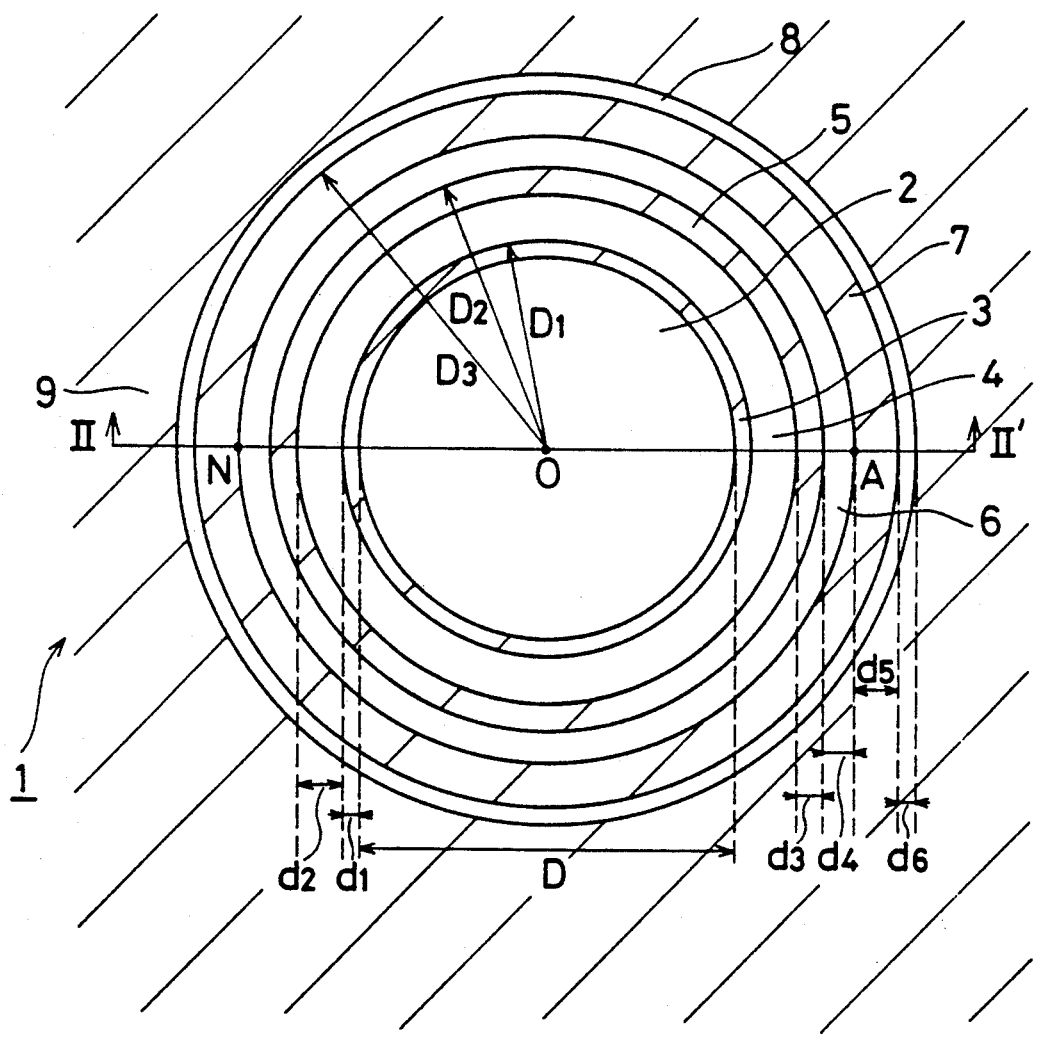
FIG. 1 is a view showing a hole pattern according to a first embodiment of the present invention.
Figure 2:
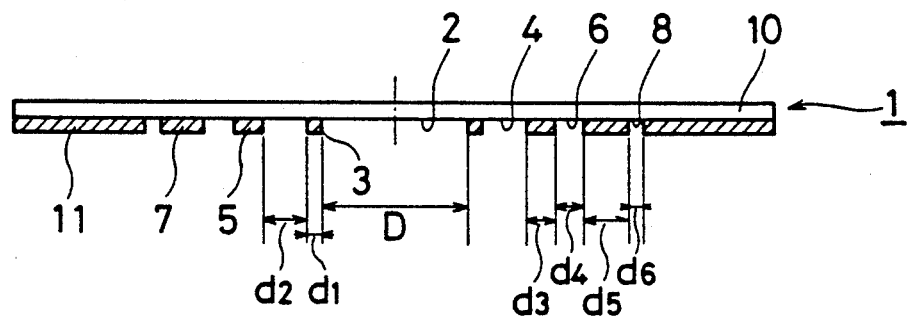
FIG. 2 is a view showing the hole pattern seen from an arrow II—II' according to the first embodiment of the present invention.
Figure 11:
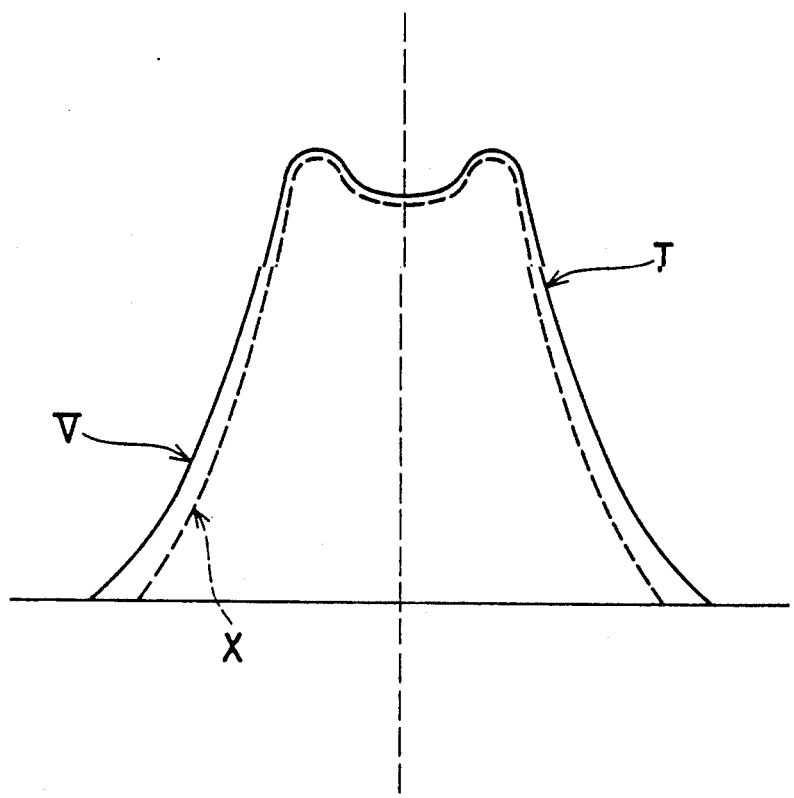
FIG. 11 is a characteristic chart showing the light intensity distribution of the hole patterns according to the prior art and the first embodiment of the present invention.
Figure 12:
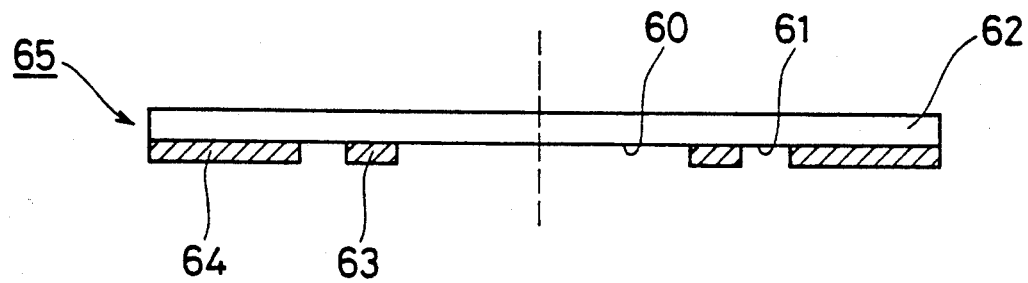
FIG. 12 is view showing a hole pattern to be compared with the hole pattern according to the first embodiment of the present invention.
Figure 13:
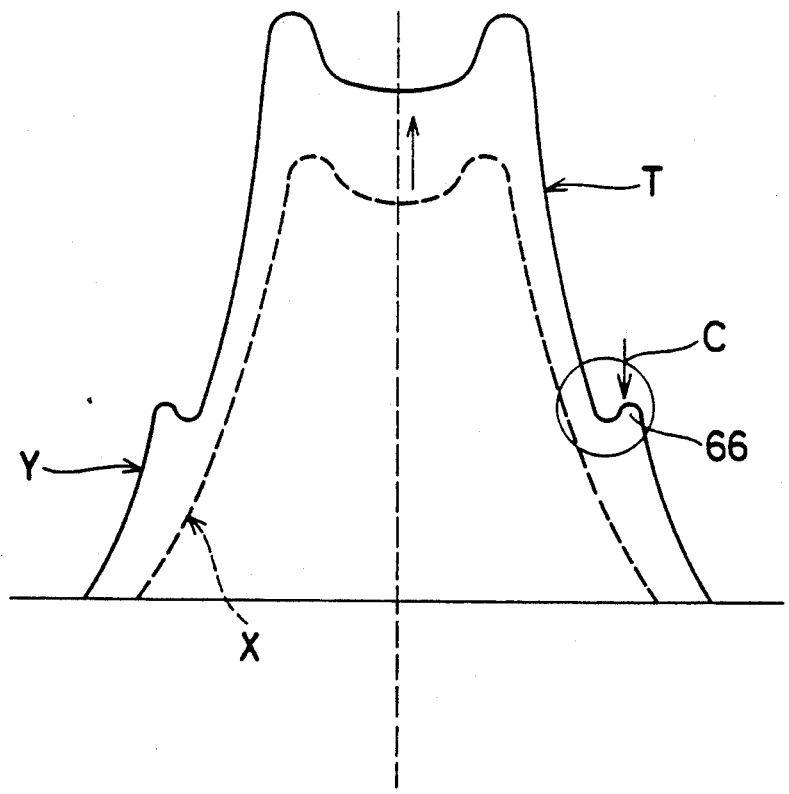
FIG. 13 is a characteristic chart showing the light intensity distribution of the hole pattern according to the prior art and the hole pattern to be compared with the hole pattern according to the first embodiment of the present invention.

First and second embodiments of the present invention will be summarized with refernce to FIGS. 11 and 13. Referring to the first embodiment, a hole pattern 1 includes a circular central light transmitting portion 2, three slit-shaped light transmitting portions 4, 6 and 8 which are concentric circles, a glass substrate 10 transparent for exposed light, and light intercepting portions 3, 5, 7 and 11 which are opaque for the exposed light for forming the light transmitting portions 2, 4, 6 and 8 as shown in FIGS. 1 and 2. Referring to the second embodiment, a hole pattern 65 includes a circular central light transmitting portion 60, a slit-shaped light transmitting portion 61 which is a concentric circle, a glass substrate 62 transparent for exposed light, and light intercepting portions 63 and 64 which are opaque for the exposed light for forming the light transmitting portions 60 and 61 as shown in FIG. 12.

FIG. 11 shows relative light intensity distribution in the case where the hole pattern 1 shown in FIGS. 1 and 2 is used. FIG. 13 shows relative light intensity distribution in the case where the hole pattern 65 shown in FIG. 12 is used.

Figure 26:
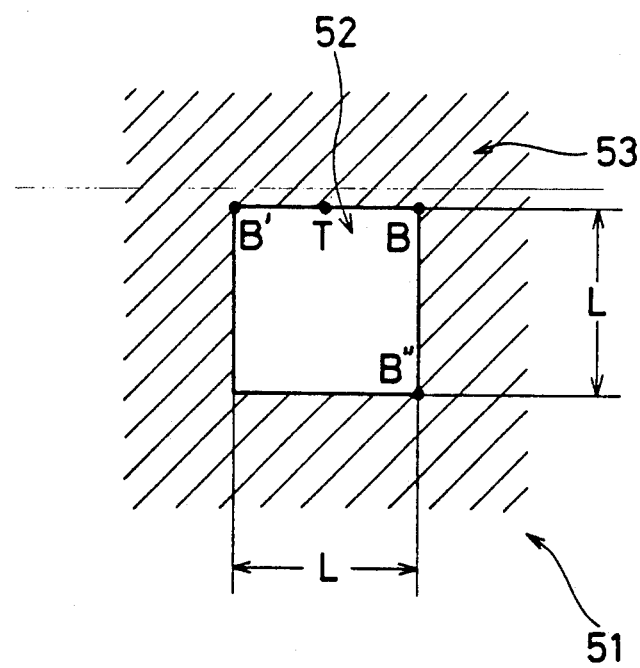
FIG. 26 is a view showing the hole pattern according to the prior art.
Figure 27:
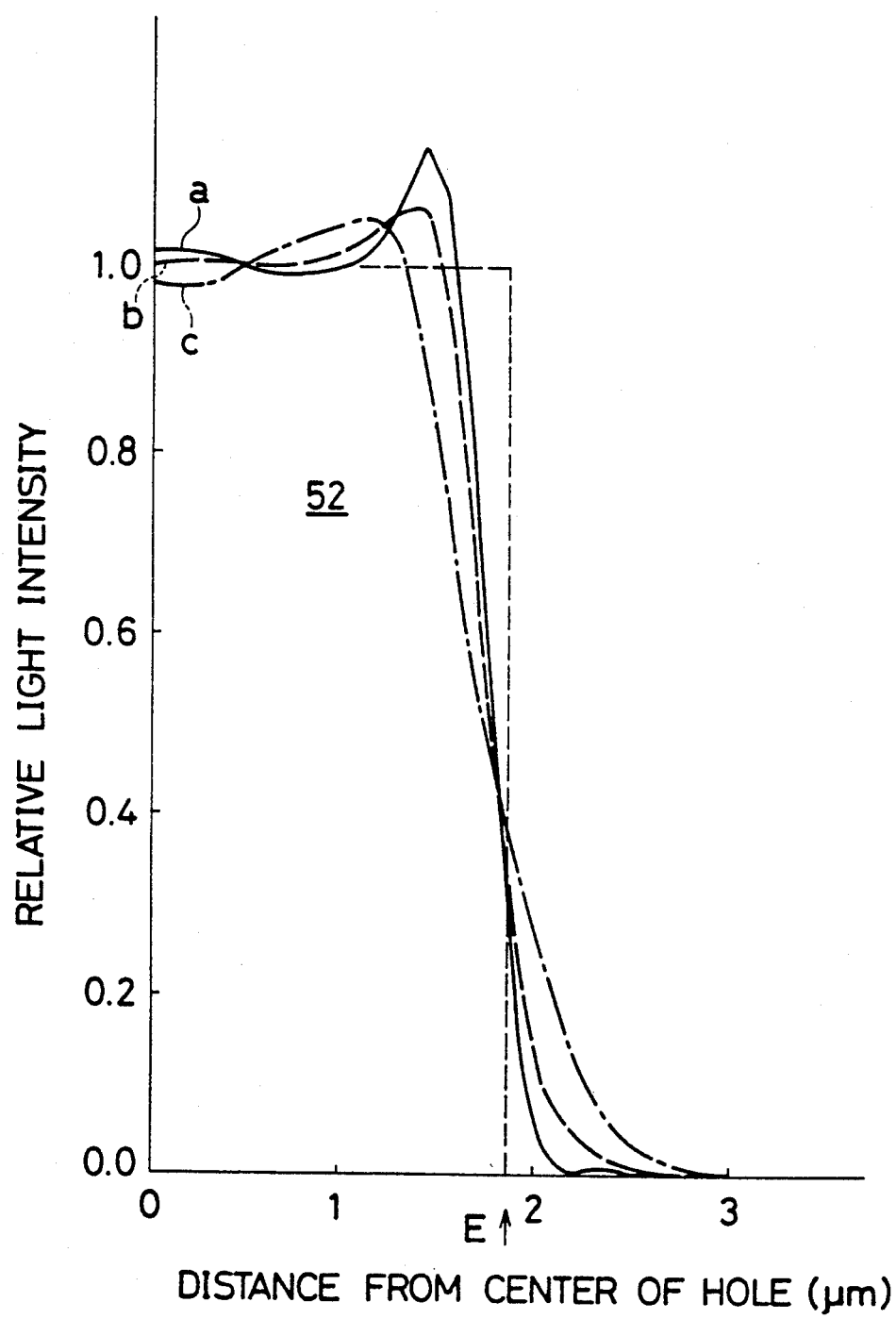
FIG. 27 is a characteristic chart showing relative light intensity distribution in the case where the hole pattern according to the prior art is used.

In FIG. 13, a relative light intensity distribution curve X shown by a broken line denotes relatives light intensity distribution on a hole pattern 51 shown in FIG. 26 according to the prior art in which there is provided no slit-shaped light transmitting portion 61, and a relative light intensity distribution curve Y shown by a solid line denotes relative light intensity distribution in the case where the slit-shaped light transmitting portion 61 is provided.

As seen from the curves X and Y, the peak value of the light intensity distribution is greater in the case where the light transmitting portion 61 is provided.

In case of just focus in which a quantity of focal shift is 0μm, particularly, a bending portion 66 is formed on the curve Y as shown in an arrow C. Consequently, it is seen that the shape of a taper portion T on the curve Y to be monotonously decreased is changed according to the focus variation of the exposure device. Accordingly, there is a possibility that the dimension after development is varied so that the focal tolerance cannot be increased.

In FIG. 11, a relative light intensity distribution curve V shown by a solid line denotes relative light intensity distribution in the case where the slit-shaped light transmitting portions 4, 6 and 8 are provided, and a relative light intensity distribution curve X shown by a broken line denotes relative light intensity distribution on the hole pattern 51 shown in FIG. 26 according to the prior art in the case where there is provided no slit-shaped light transmitting portion 61. As seen from the curves V and X, the peak values of the light intensity distribution are equal irrespective of focal shift. However, the shape of the taper portion T of the curve V does not have the bending portion 66 and presents monotonous descrease differently from the shape of the taper portion T of the curve Y. Referring to the curve Y of the hole pattern 65 is which only one slit-shaped light transmitting portion 61 is provided, the shape of the taper portion T depends on the focus variation of the exposure device. Referring to the curve V of the hole pattern 1 in which three slit-shaped light transmitting portions are provided, the relative light intensity distribution on the exposed plane of the resist film is not changed inreespective of the focus variation. Consequently, if the hole pattern 1 having three slit-shaped light transmitting portions is used in an exposure mechanism, the dimension after development is not affected. Thus, the focal tolerance can be increased.

Figure 14:
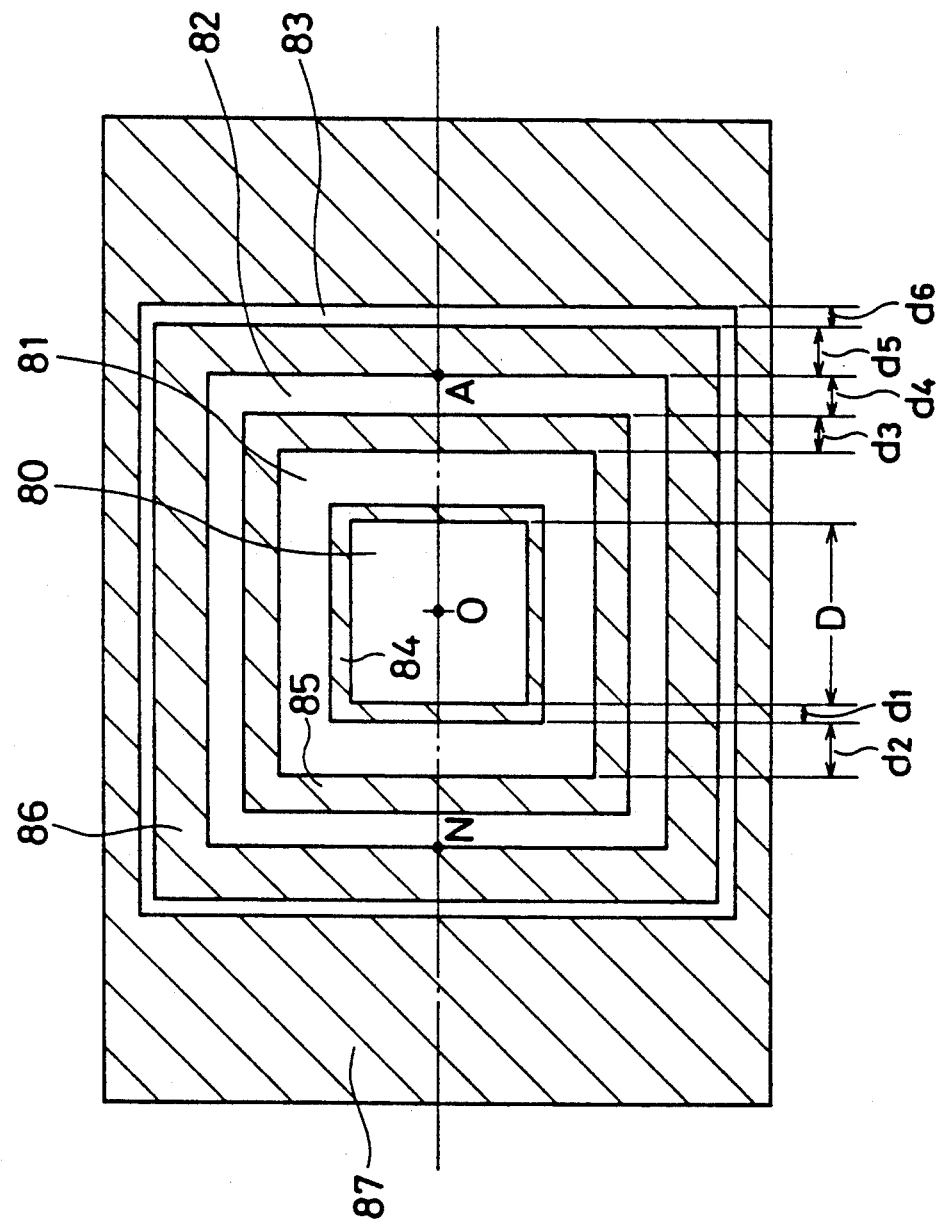
FIGS. 14 and 15 are views showing hole patterns according to second and third embodiments of the present invention, respectively.
Figure 15:
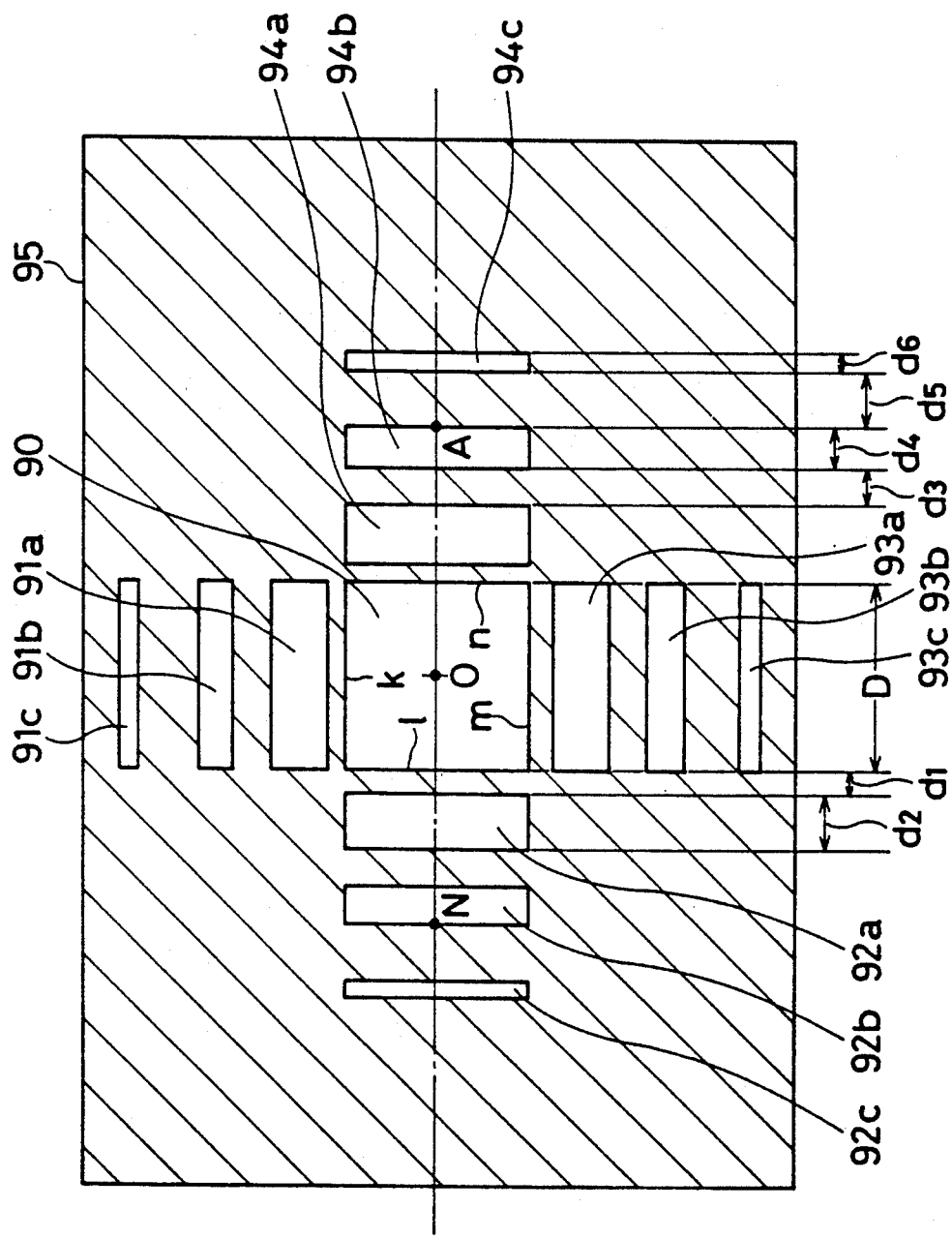

Preferred examples of the hole pattern according to the present invention are as follows:

(I) a hole pattern including a circular central light transmitting portion and a plurality of slit-shaped light transmitting portions which are provided like concentric circles around the central light transmitting portion;

(II) a hole pattern including a rectangular central light transmitting portion 80, a plurality of slit-shaped light transmitting portions 81 to 83 which are provided like frames to sequentially surround the central light transmitting portion 80, to light intercepting portions 84 to 87 for forming the light transmitting portion 80 to 83 (see FIG. 14); and (III) a hole pattern including a rectangular central light transmitting portion 90, and a plurality of slit-shaped light transmitting portion 91a to 91c, 92a to 92c, 93a to 93c and 94a to 94c which are provided like small rectangles to sequentially surround the sides k, l, m and n of the central light transmitting portion 90 (see FIG. 15).

In respect of the increase of the focal tolerance, the hole pattern (I) is the most preferable. The reason is that distances D1, D2 and D3 from the central O of the circular central light transmitting portion 2 to the slit-shaped light transmitting portions 4, 6 and 8 are equal over the entire periphery of the central light transmitting portion 2 as shown in FIGS. 1 and 2. Also in case of the hole patterns (II) and (III), since a plurality of slit-shaped light transmitting portions are provided, the focal tolerance cannot be made greater than that of the circular hole pattern (I) but diffraction effects can further be promoted and the focal tolerance can be made greater than the hole pattern according to the prior art shown in FIG. 26.

Preferred embodiments of the present invention will be described in detail with reference to the drawings. The present invention should not be construed as being limited by the following embodiments.

Figure 19:
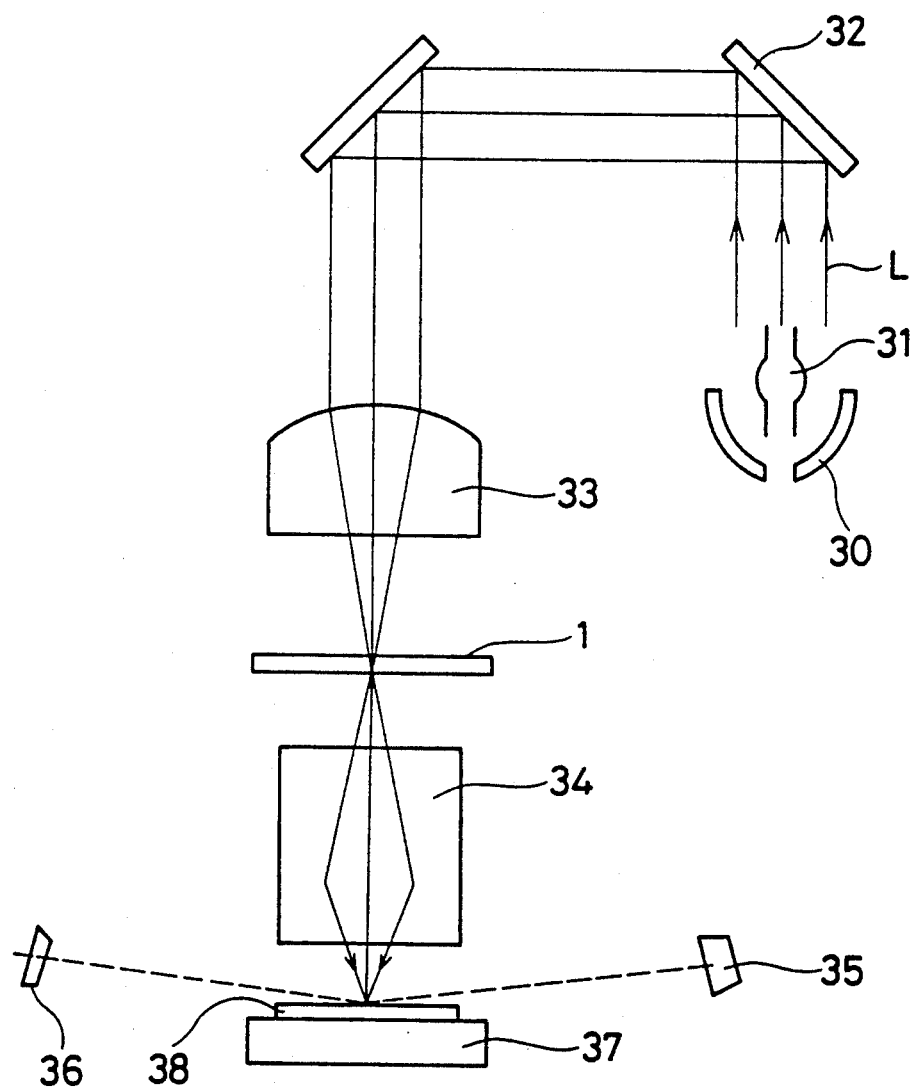
FIG. 19 is a view showing the entire structure of an exposure mechanism.
Figure 20:
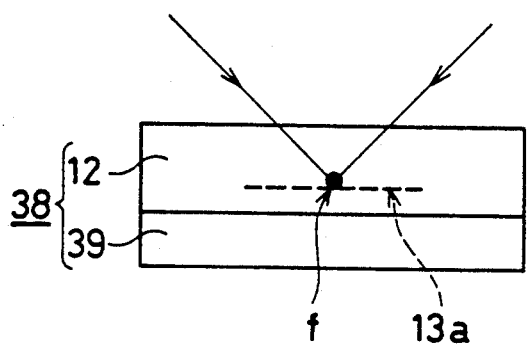
FIG. 20 is a view showing the state of just focus.
Figure 21:
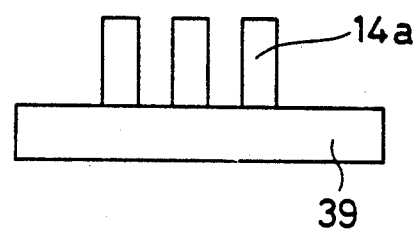
FIG. 21 is a view showing a resist pattern formed in the state of just focus.
Figure 22:
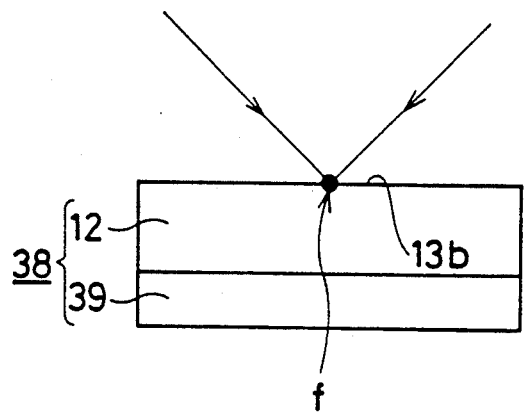
FIG. 22 is a view showing the state of defocus.
Figure 23:
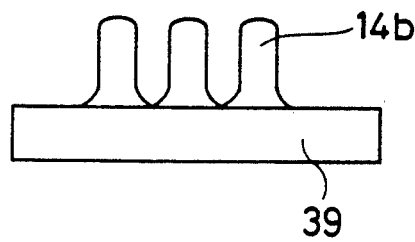
FIG. 23 is a view showing a resist pattern formed in the state of defocus.
Figure 24:
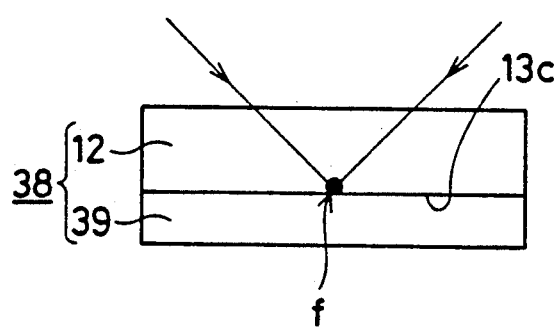
FIG. 24 is a view showing the state of defocus.
Figure 25:
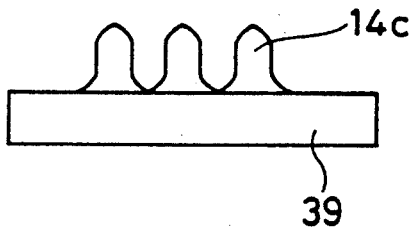
FIG. 25 is a view showing a resist pattern formed in the state of defocus.

As described above, an exposure mechanism comprises an exposure device shown in FIG. 19 and hole pattern 1 for forming a resist pattern used in a photolithography process when a semiconductor device is fabricated.

As shown in FIGS. 1 and 2, the hole pattern 1 includes a circular central light transmitting portion 2, slit-shaped light transmitting portions 4, 6 and 8, and Cr light intercepting portions 3, 5, 7 and 11. The central light transmitting portion 2 is formed on a glass substrate 10 and has a center O and a diameter D of 2.0μm, through which exposed light can pass. The slit-shaped light transmitting portions 4, 6 and 8 are provided around the central light transmitting portion 2. The light intercepting portions 3, 5, 7 and 11 are formed like concentric circles on the glass substrate 10 so as to form the central light tramsmitting portion 2 and slit-shaped light transmitting portions 4, 6 and 8.

The slit-shaped light transmitting portion 4 has a with d2 0.3μm. The slit-shaped light transmitting portion 6 has a width d4 of 0.2μm. The slit-shaped light transmitting portion 8 has a width d6 of 0.1μm.

The light intercepting portion 3 is ring-shaped and has a width d1 of 0.1μm. The light intercepting portion 5 is ring-shaped and has a width d3 of 0.2μm. The light intercepting portion 7 is ring-shaped and has a width d5 of 0.3μm. The light intercepting portion 11 forms the outermost frame of the hole pattern 1.

Points A and N denote the boundary points of the slit-shaped light transmitting portion 6 and the light intercepting portion 7. A line segment AN (=M) is the mask dimension (opening diameter) of the hole pattern 1. Line segments OA and ON have a length of 1.8 μm.

There will be summarized a method for forming a hole pattern 1.

Figure 3:
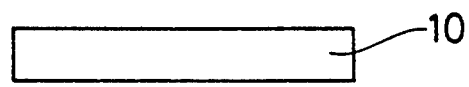
FIGS. 3 to 8 are views sequentially showing a method for forming the hole pattern according to the first embodiment of the present invention.
Figure 4:
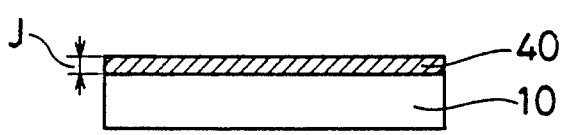
Figure 5:
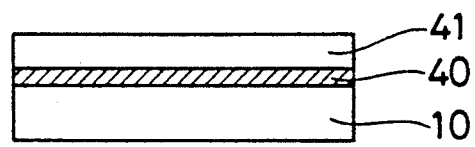

A Cr film 40 having a thickness J of 0.1 μm and a resist film 41 are sequentially laminated on a glass substrate 10 shown in FIG. 3 (see FIGS. 4 and 5).

Figure 6:
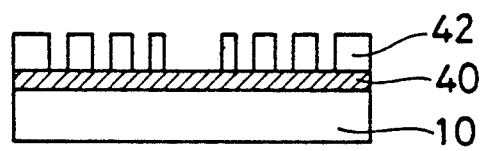
Figure 7:
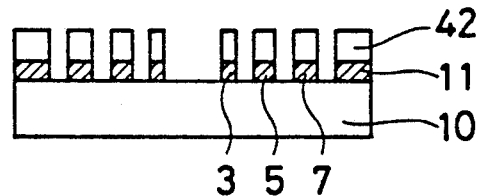
Figure 8:
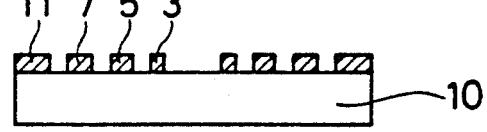

Subsequently, a resist pattern 42 is formed by using a mask (not shown) (see FIG. 6). Then, the Cr film 40 is patterned by using the resist pattern 42 as a mask so as to form light intercepting portions 3, 5, 7 and 11 (see FIG. 7). Thereafter, the resist pattern 42 is removed to form a hole pattern 1 (see FIG. 8).

There will be summarized operation. In the case where the hole pattern 1 on the reticle is used, the slit-shaped light transmitting portions 4, 6 and 8 are provided around the central light transmitting portion 2 so that the allowance of a focal distance can be increased (a focal tolerance can be increased). Also in the state of defocus, no difference is made to relative light intensity distribution by the diffraction effects of the central light transmitting portion 2 and the slit-shaped light transmitting portions 4, 6 and 8, or the mutual diffractions effects of the slit-shaped light transmitting portions 4, 6 and 8. Consequently, the focal tolerance can be increased. The relative light intensity distribution on the exposed plane of the resist film is not changed irrespective of focus variation. As a result, a dimension after development is not affected. In addition, the light transmitting portions 2, 4, 6 and 8 have circular patterns so that distances from the center O of the hole pattern 1 to the light transmitting portions can be equal. Thus, the diffraction effects can further be promoted as compared with light transmitting portions having other patterns.

FIG. 9 shows a curve a illustrating the change of relative light intensity distribution in the case where a quantity of focal shift is 0 $\mu$m, a curve b illustrating the change of relative light intensity distribution in the case where the quantity of focal shift is 1 $\mu$m, and a curve c illustrating the change of relative light intensity distribution in the case where the quantity of focal shift is 2 $\mu$m, in which the hole pattern 1 according to the present embodiment is used.

The relative light intensity distribution is calculated by computer simulation. In FIG. 9, an axis of ordinates denotes a relative light intensity. In this case, to 1 is set the relative light intensity obtained immediately after light is transmitted through the hole pattern 1. An axis of abscissas denotes a distance from the center O of the hole pattern 1.

It is seen that the relative light intensity distribution is not changed within a range R from 0.1 to 0.7 irrespective of focal shift. The point A of the hole pattern 1 is shown by a broken line apart from the center O by a distance of 1.8 $\mu$m as shown by an arrow F.

Figure 17:
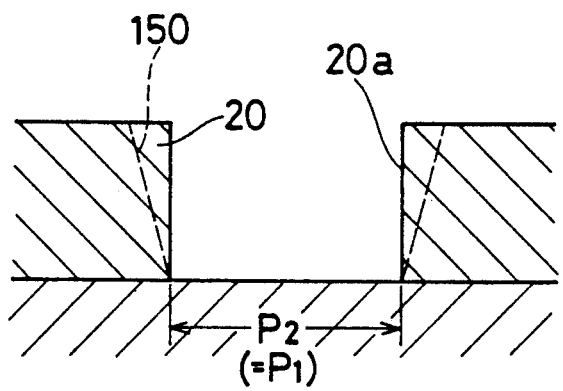
FIG. 17 is a view showing the shape of the contact hole formed by the hole patterns according to the prior art and the first embodiment of the present invention in the case where the focus is not shifted.

The shape of a contact hole 150 is substantially the same as those of contact holes 151 and 152. The contact hole 150 is formed when there is no focusing variation in the state of just focus in which a quantity of focal shift is 0 $\mu$m as shown in FIG. 17, for example. The contact holes 151 and 152 are formed in the state of defocus in which the quantity of focal shift is 1 or 2 $\mu$m, for example. More specifically, it is seen that the change of a line width after development is seldom caused.

Figure 10:
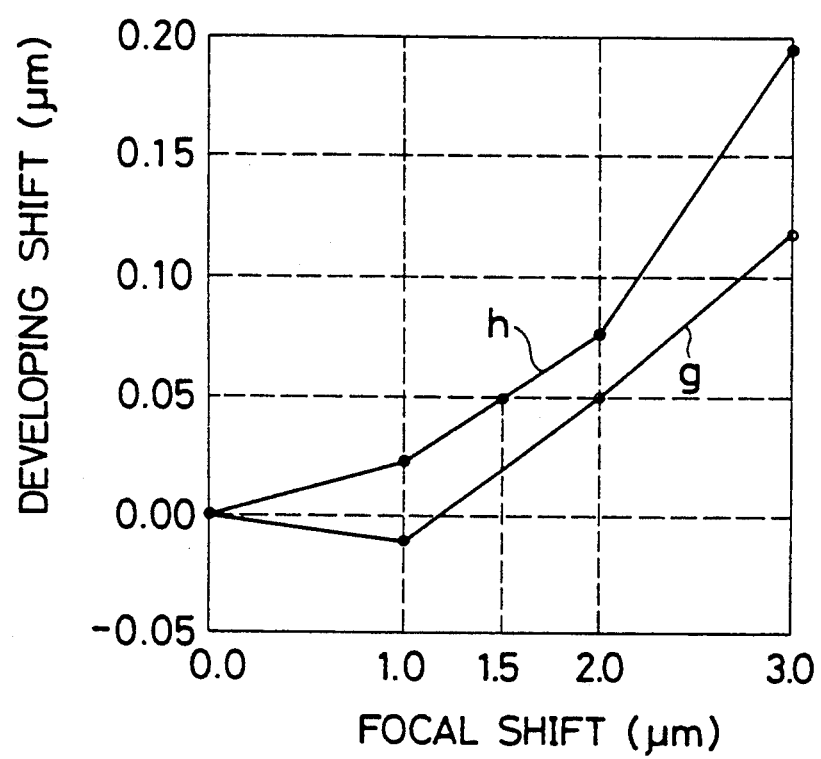
FIG. 10 is a characteristic chart showing the focal shift-developing shift between a hole pattern according to the prior art and the hole pattern according to the first embodiment of the present invention.

FIG. 10 shows the developing shift (the change of a line width) of a resist after development when exposure is carried out with focus shifted by using hole patterns according to the present embodiment (shown by a curve g) and the prior art (shown by a curve h).

As seen from FIG. 10, in the case where exposure is carried out by using the pattern 51 according to the prior art, focus is shifted by 1.5 $\mu$m so that developing shift of 0.05 $\mu$m is caused.

On the other hand, in the case where exposure is carried out by using the pattern 1 according to the present embodiment, the focus is shifted by 2.0 $\mu$m so that a line width is changed by 0.05 $\mu$m. More specifically, the allowance of the change of a line width is increased by 33% [(2.0−1.5)/1.5] for the focal shift. Consequently, it is seen that the change of a line width is decreased for focusing variation at an exposure step in a hole forming process. In the case where the hole pattern 1 having a mask dimension M according to the present embodiment is used, the shapes of the contact holes 150, 151 and 152 to be formed are almost the same irrespective of the state of focus as shown in FIGS. 16, 17 and 18.

Figure 16:
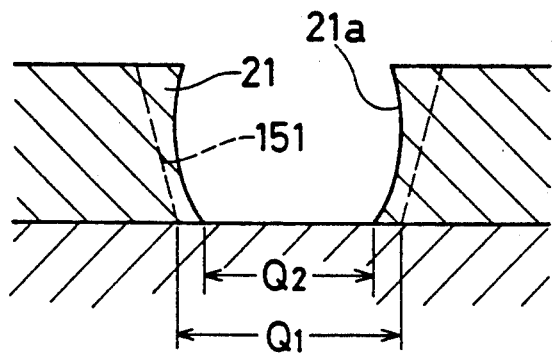
FIG. 16 is a view showing the shape of a contact hole formed by the hole patterns according to the prior art and the first embodiment of the present invention in the case where focus is shifted.
Figure 18:
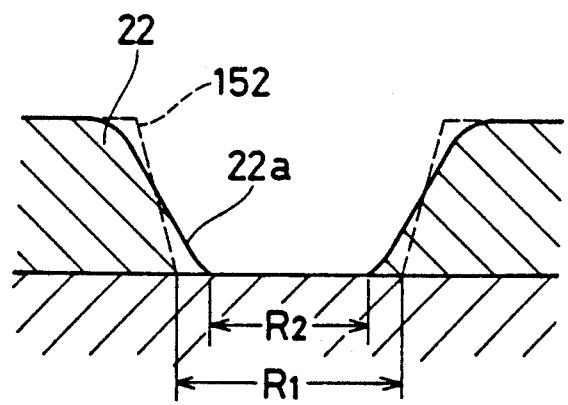
FIG. 18 is a view showing the shape of the contact hole formed by the hole patterns according to the prior art and the first embodiment of the present invention in the case where the focus is shifted.

In FIGS. 16, 17 and 18, the diameters of the contact holes 150, 151 and 152 shown by dotted lines are represented by P1, Q1 and R1. As seen from FIG. 17, P1 is equal to P2. As seen from FIGS. 16 and 18, the contact hole diameters Q1 and R1 approximate P1.

Consequently, the controllability of a hole diameter can be improved. More specifically, when exposure is carried out by using the pattern 1 according to the present embodiment, the depth of focus can be enhanced in a lithography process.

According to the present invention, the hole pattern has a structure in which a plurality of slit-shaped light transmitting portions are provided around the central light transmitting portion. Also in the state of defocus, consequently, no difference is made to the relative light intensity distribution by the diffraction effects of the central light transmitting portion and the slit-shaped light transmitting portions or the mutual diffraction effects of the slit-shaped light transmitting portions. As a result, the focal tolerance can be increased so that the relative light intensity distribution on the exposed plane of the resist film is not changed irrespective of the focus variation. Thus, the dimension after development is not affected.

What is claimed is:

1. An exposure mechanism having a hole pattern for forming a resist pattern to be used in a photolithography process when a semiconductor device is fabricated, the hole pattern comprising;

a central light transmitting portion provided on a transparent substrate, through which exposed light can pass, a plurality of slit-shaped light transmitting portions provided around the central light transmitting portion, and a light intercepting portion provided on the transparent substrate for forming the central light transmitting portion and the slit-shaped light transmitting portions.

2. The exposure mechanism according to claim 1, wherein the central light transmitting portion is circular and the slit-shaped light transmitting portions are three slit-shaped light transmitting portions which are provided like concentric circles around said circular central light transmitting portion.

3. The exposure mechanism according to claim 1, wherein the central light transmitting portion is rectangular and the slit-shaped light transmitting portions are a plurality of slit-shaped light transmitting portions which are provided like frames to sequentially surround said rectangular central light transmitting portion.

4. The exposure mechanism according to claim 1, wherein the central light transmitting portion is rectangular and the slit-shaped light transmitting portions are a plurality of slit-shaped light transmitting portions which are provided like small rectangles to sequentially surround the sides of said rectangular central light transmitting portion.

* * * * *